(12) United States Patent
Hamilton et al.

(10) Patent No.: US 9,067,238 B2
(45) Date of Patent: *Jun. 30, 2015

(54) METHOD FOR IMPROVING PLATING ON NON-CONDUCTIVE SUBSTRATES

(71) Applicant: MacDermid Acumen, Inc., Waterbury, CT (US)

(72) Inventors: Robert Hamilton, Torrington, CT (US); Ernest Long, Burlington, CT (US); Andrew M. Krol, Bristol, CT (US)

( * ) Notice: Subject to any disclaimer, the term of this patent is extended or adjusted under 35 U.S.C. 154(b) by 227 days.

This patent is subject to a terminal disclaimer.

(21) Appl. No.: 13/741,446

(22) Filed: Jan. 15, 2013

(65) Prior Publication Data

US 2013/0136869 A1 May 30, 2013

Related U.S. Application Data

(63) Continuation of application No. 12/693,548, filed on Jan. 26, 2010.

(51) Int. Cl.
| | |
|---|---|
| *B05D 1/18* | (2006.01) |
| *B05D 3/00* | (2006.01) |
| *C08J 7/18* | (2006.01) |
| *B05D 3/06* | (2006.01) |
| *C23C 18/16* | (2006.01) |
| *C23C 18/20* | (2006.01) |
| *C23C 18/38* | (2006.01) |
| *H05K 3/18* | (2006.01) |

(52) U.S. Cl.
CPC .............. *B05D 3/06* (2013.01); *C23C 18/1612* (2013.01); *C23C 18/204* (2013.01); *C23C 18/2086* (2013.01); *C23C 18/38* (2013.01); *H05K 3/185* (2013.01); *H05K 2201/0236* (2013.01); *H05K 2201/09118* (2013.01); *H05K 2203/0786* (2013.01); *H05K 2203/107* (2013.01); *H05K 2203/122* (2013.01)

(58) Field of Classification Search
CPC .......... B05D 3/06; B05D 3/063; B05D 3/101; C23C 18/1603; C23C 18/1608; C23C 18/1612; C23C 18/204; C23C 18/2086; H05K 3/182; H05K 2201/0209; H05K 2201/0227; H05K 2201/0224
USPC ................... 427/430.1, 443.1, 553, 554, 555
See application file for complete search history.

(56) References Cited

U.S. PATENT DOCUMENTS

| | | | | |
|---|---|---|---|---|
| 3,900,320 | A | * | 8/1975 | Rolker et al. ................. 430/324 |
| 5,051,312 | A | | 9/1991 | Allmer |
| 5,476,580 | A | * | 12/1995 | Thorn et al. ................. 205/122 |
| 5,929,516 | A | | 7/1999 | Heerman et al. |
| 6,627,544 | B2 | | 9/2003 | Izumi et al. |
| 7,060,421 | B2 | | 6/2006 | Naundorf |
| 7,160,583 | B2 | * | 1/2007 | Frey et al. ..................... 427/437 |
| 7,182,995 | B2 | | 2/2007 | Muto et al. |
| 7,276,267 | B2 | | 10/2007 | Schauz |
| 7,384,690 | B2 | * | 6/2008 | Machida et al. .............. 428/328 |
| 7,578,888 | B2 | | 8/2009 | Schildmann |
| 2003/0207567 | A1 | | 11/2003 | Izumi et al. |
| 2004/0104040 | A1 | | 6/2004 | Schauz |
| 2004/0237295 | A1 | | 12/2004 | Wakizaka et al. |
| 2006/0121249 | A1 | | 6/2006 | Muto et al. |
| 2006/0257630 | A1 | | 11/2006 | Hartwich et al. |
| 2007/0092638 | A1 | * | 4/2007 | Schoedner et al. .......... 427/98.6 |
| 2007/0126651 | A1 | | 6/2007 | Snyder et al. |
| 2008/0171181 | A1 | | 7/2008 | Zaderej |
| 2009/0022885 | A1 | | 1/2009 | Matsumoto et al. |
| 2009/0123656 | A1 | | 5/2009 | Long et al. |
| 2009/0239079 | A1 | | 9/2009 | Wojtaszek et al. |
| 2009/0297802 | A1 | | 12/2009 | Sastry et al. |

* cited by examiner

*Primary Examiner* — Michael Wieczorek
(74) *Attorney, Agent, or Firm* — Carmody Torrance Sandak & Hennessey LLP

(57) ABSTRACT

A method of treating a laser-activated thermoplastic substrate having a metal compound dispersed therein is described. The substrate is contacted with an aqueous composition comprising: (i) a thiol functional organic compound; (ii) an ethoxylated alcohol surfactant; and (iii) xanthan gum. By use of the treatment composition, when the substrate is subsequently laser-activated and plated by electroless plating, extraneous plating of the substrate is substantially eliminated.

15 Claims, No Drawings

METHOD FOR IMPROVING PLATING ON NON-CONDUCTIVE SUBSTRATES

FIELD OF THE INVENTION

This invention relates to treatment compositions for improved plating on non-conductive substrates.

BACKGROUND OF THE INVENTION

Molded-one piece articles are used, for example, in forming printed circuit boards. In many instances, two separate molding steps are used to form two portions of the article. Two-shot molding is a means of producing devices having two portions, such as molded interconnect devices (including printed circuit boards), from a combination of two injection molded polymers. The process is also used for producing two-colored molded plastic articles and for combining hard and soft plastics in one molded part.

Molded interconnect devices (MIDs) are used in a variety of industries and applications, including for example, sensors, switches, connectors, instrument panels and controllers. MIDs typically have at least one electrical trace created, usually by plating of a conductive metal, on a molded plastic structure.

One method of creating MIDs involves molding part of a structure in one mold, using a first plastic material and then placing the structure, which has been created in the first mold, in a second mold and then molding the second portion of the part with a second plastic material. The two plastic materials are chosen so that a conductive material can be plated on one of the plastic materials and not on the other plastic material. The conductive material, which can be plated on the platable plastic, becomes a conductive trace or other feature. The conductive trace carries data signals, control signals or power to and from components of the application. A photo-imaging process may be used in which a mask is applied and the coated mask is selectively exposed to ultraviolet (UV) light to selectively harden the mask to non-circuit areas. The unexposed mask is chemically removed, revealing a circuit pattern. The pattern is then plated with copper or other metal to achieve a desired circuit performance.

More recent developments in plastic injection molding have allowed for molding MIDs in a single shot. For example, a structure can be produced from a single photosensitive nonconductive material, such as a thermoplastic doped with an organic metal complex. An interconnect path is then written on the molded structure, for example, by using a laser which breaks the metal atoms from the organic ligands, allowing the metal atoms to act as nuclei for copper plating. The laser beam produces a local activation of the substrate surface, by which the desired circuit layout is made. Thereafter, immersion in a metal plating bath, which is typically copper, allows plating of metal onto areas etched by the laser beam, allowing traces or other features to be created in those areas. This process is known as a Laser Direct Structure (LDS) process and provides designers with a simpler one-shot molding process that allows for creation of circuitry after the molding process is complete, without a tooling change, and provides the capability to produce a component with a higher resolution and smaller footprint.

The LDS process provides a straightforward three-step process that includes: (1) creating the substrate using a standard injection molding process utilizing a laser-activatable non-conductive substrate material that contains a metal compound; (2) activating the nonconductive material with a laser, such that the metal compound is broken down into its associated metal which acts as a seed layer for subsequent electroless plating thereon; and (3) electroless plating of the activated portions of the non-conductive substrate.

The laser activation step creates a micro-etched surface that provides excellent bonding characteristics for the electroless metal that is subsequently applied thereto. The electroless metal may comprise copper or copper alloy although other electroless metals are also usable.

A problem associated with substrates formed by the LDS process, is that extraneous plating can occur, particularly on rough areas of the substrate or on areas of the substrate that have been mechanically damaged.

Based thereon, it is an object of the present invention to provide a method of treating molded interconnect devices to avoid undesirable extraneous plating.

SUMMARY OF THE INVENTION

It is an object of the present invention to provide a method of treating metal impregnated non-conductive substrates.

It is another object of the present invention to provide a method of treating laser-activatable molded interconnect devices (MIDs).

It is another object of the present invention to provide a method of minimizing extraneous plating on laser-activatable MIDs.

To that end, the present invention relates generally to a method of treating a laser-activatable non-conductive substrate, the method comprising the steps of:
  a) treating the non-conductive substrate with an aqueous composition comprising:
    i) an aqueous mixture of a thiol functional organic compound;
    ii) preferably, a surfactant; and
    iii) preferably, xanthan gum; and
  b) laser activating surfaces of the non-conductive substrate.

In another embodiment, the present invention relates generally to a method of treating a laser-activated thermoplastic substrate having a metal compound dispersed therein, the method comprising the steps of:
  a) contacting the substrate with an aqueous composition comprising:
    i) an aqueous mixture of a thiol functional organic;
    ii) preferably, a surfactant; and
    iii) preferably, xanthan gum; and
  b) selectively contacting the substrate with a laser beam such that the portions of the substrate contacted with the laser beam become receptive to electroless plating;
  whereby, when the treated laser-activated substrate is subsequently plated by electroless plating, extraneous plating of the substrate can be substantially eliminated.

DETAILED DESCRIPTION OF THE PREFERRED EMBODIMENTS

As discussed above, Molded Interconnect Devices (MIDs) and other similar substrates can be fabricated using metal compound containing non-conductive materials that are activatable by laser. The laser treatment activates selective areas of the non-conductive substrate which are then plated with an electroless metal, such as electroless copper or copper alloy. A problem associated with this type of substrate and its processing is that extraneous plating can occur, especially on rough areas of the component or on areas of the component that have otherwise been mechanically damaged or roughened.

The inventors of the present invention have found that the occurrence of extraneous plating can be substantially eliminated or prevented by treating the metal containing non-conductive substrate with the treatment composition of the invention.

The treatment composition of the invention typically comprises:

a) an aqueous mixture of a thiol functional organic compound;
b) preferably, surfactant; and
c) preferably, xanthan gum.

The thiol functional organic compound is typically emulsified in water using xanthan gum and the surfactant.

The concentration of xanthan gum in the composition is preferably in the range of about 1 to 10 g/l.

The surfactant is preferably an ethoxylated alcohol, more preferably a C-10 alcohol ethoxylate. However, other similar surfactants would also be usable in the present invention. Suitable ethoxylated alcohols are available, for example, from BASF Corporation, under the tradename Lutensol®. The concentration of ethoxylated alcohol in the composition is preferably in the range of about 0.1 to 10 g/l.

Thiols are organic compounds that contain an —SH functional group, also known as a mercaptan. Various mercaptans are usable in the composition of the invention, including, for example, C12 to C18 chain length mercaptans. Suitable thiol functional organics include alkane thiols such as dodecanethiol, lauryl mercaptan, cetyl mercaptan, and stearyl mercaptan, as well as alkyl thioglycollate, stearyl thioglycollate, cetyl thioglycollate, methyl mercaptan, n-butyl mercaptan, cyclohexyl mercaptan, n-dodecyl mercaptan, n-propyl mercaptan, n-octyl mercaptan and t-nonyl mercaptan, by way of example and not limitation. In one embodiment, the thiol functional organic is a stearyl mercaptan.

The thiol functional organic compound is typically usable in the composition of the invention at a concentration of about 1 to 20 g/l.

The aqueous emulsion composition of the invention is particularly suited for treating surfaces of laser activatable MIDs or other similar substrates that comprise non-conductive materials such as thermoplastic resins, thermosetting resin, and ceramics that are impregnated with or otherwise contain copper or other metal compounds dispersed therein. The use of the treatment composition advantageously eliminates extraneous plating on these non-conductive substrates.

The non-conductive substrate may comprise, for example a thermoplastic resin, a thermosetting resin or a ceramic material. In one embodiment, the non-conductive substrate comprises a thermoplastic resin such as a polycarbonate/acrylonitrile-butadiene-styrene (PC/ABS) blend resin, cross-linked polybutyleneterephthalate (PBT), nylon, liquid crystal polymers or other similar materials, by way of example and not limitation.

The metal compound typically comprises a non-conductive metal oxide, as described for example in U.S. Pat. No. 7,060,421 to Naundorf et al. and U.S. Patent Publication No. 2008/0171181 to Zaderej, the subject matter of each of which is herein incorporated by reference in its entirety. In one embodiment the metal compound contains copper.

The laser is used provide electromagnetic radiation to release the metal nuclei from the metal compound. In one embodiment, the laser is a commercially available Nd:YAG laser. Other lasers would also be usable in the practice of the invention.

The present invention also relates to a method of treating a non-conductive substrate having a metal-containing compound disposed therein, wherein said non-conductive substrate is capable of being selectively activated by a laser to accept plating thereon, the method comprising the steps of:

a) treating the non-conductive substrate with an aqueous composition comprising:
i) a thiol functional organic compound;
ii) preferably, a surfactant; and
iii) preferably, xanthan gum;
b) selectively laser activating portions of the surface of the non-conductive substrate;
thereafter, the treated and activated substrate is plated by electroless plating on the activated portions of the substrate.

The non-conductive substrate is typically contacted, with the aqueous composition by various methods including, but not limited to dipping, spraying and horizontal flooding. Other methods would also be known to those skilled in the art.

The compositions are preferably contacted with the non-conductive substrate at a temperature of about 50° C. and for a sufficient period of time to obtain the desired result. However, it is contemplated that temperatures between 20 to 70° C. would also be usable. In addition, the contact period is typically in the range of about 10 to 300 seconds, depending on the method of contact.

What is claimed is:

1. A method of treating a laser-activatable non-conductive substrate that comprises a metal compound, the method comprising the steps of:
   a) treating the laser-activatable non-conductive substrate that comprises the metal compound with an aqueous composition comprising:
      i) a thiol functional organic compound; and
      ii) optionally, a surfactant;
   b) selectively laser activating portions of a surface of the laser-activatable non-conductive substrate;
   c) contacting the substrate with an electroless plating bath such that areas of the laser-activatable non-conductive substrate which were contacted by the laser plate, but areas that were not contacted by the laser do not plate.

2. The method according to claim 1, wherein the thiol functional organic is selected from the group consisting of dodecanethiol, lauryl mercaptan, cetyl mercaptan, and stearyl mercaptan, alkyl thioglycollate, stearyl thioglycollate, cetyl thioglycollate, methyl mercaptan, n-butyl mercaptan, cyclohexyl mercaptan, n-dodecyl mercaptan, n-propyl mercaptan, n-octyl mercaptan, t-nonyl mercaptan and combinations of one or more of the foregoing.

3. The method according to claim 2, wherein the thiol functional organic comprises stearyl mercaptan.

4. The method according to claim 1, wherein the concentration of the thiol functional organic in the aqueous composition is about 1 to about 20 g/l.

5. The method according to claim 1, wherein the surfactant comprises an ethoxylated alcohol surfactant.

6. The method according to claim 5, wherein the concentration of the ethoxylated alcohol surfactant in the aqueous composition is between about 0.1 to about 10 g/l.

7. The method according to claim 1, wherein the aqueous compositions also comprises xanthum gum.

8. The method according to claim 7, wherein the aqueous composition comprises a surfactant.

9. The method according to claim 1, wherein the aqueous composition comprises a surfactant.

10. The method according to claim 1, wherein the electroless plating bath comprises an electroless copper plating bath.

11. The method according to claim 1, wherein the laser-activatable non-conductive substrate comprises thermoplastic resins or thermosetting resins.

12. The method according to claim 11, wherein the laser-activatable non-conductive substrate comprises a thermoplastic resin selected from the group consisting of polycarbonate/acrylonitrile butadiene styrene blend resins, cross-linked polybutyleneterephthalate, nylon, and liquid crystal polymers.

13. The method according to claim 12, wherein the laser-activatable non-conductive substrate comprises a polycarbonate/acrylonitrile-butadiene-styrene blend resin.

14. The method according to claim 1, wherein the laser-activatable non-conductive substrate is impregnated with a copper compound.

15. A method of treating a laser-activatable non-conductive substrate that comprises a metal compound, the method comprising the steps of:
   a) treating the laser-activatable non-conductive substrate that comprises the metal compound with an aqueous composition comprising:
      i) a thiol functional organic compound selected from the group consisting of dodecanethiol, lauryl mercaptan, cetyl mercaptan, stearyl mercaptan, alkyl thioglycollate, stearyl thioglycollate, cetyl thioglycollate, methyl mercaptan, n-butyl mercaptan, cyclohexyl mercaptan, n-dodecyl mercaptan, n-propyl mercaptan, n-octyl mercaptan, t-nonyl mercaptan and combinations of one or more of the foregoing; and
      ii) optionally, a surfactant;
   b) selectively laser activating portions of a surface of the laser-activatable non-conductive substrate;
   c) contacting the substrate with an electroless plating bath such that areas of the laser-activatable non-conductive substrate which were contacted by the laser plate, but areas that were not contacted by the laser do not plate.

* * * * *